United States Patent
Chen et al.

(10) Patent No.: US 12,249,484 B2
(45) Date of Patent: Mar. 11, 2025

(54) METHODS AND APPARATUS FOR CONTROLLING RADIO FREQUENCY ELECTRODE IMPEDANCES IN PROCESS CHAMBERS

(71) Applicant: Applied Materials, Inc., Santa Clara, CA (US)

(72) Inventors: Jian Janson Chen, Fremont, CA (US); Yi Yang, Xi'an (CN); Chong Ma, Xi'an (CN); Yuan Xue, Xi'an (CN)

(73) Assignee: APPLIED MATERIALS, INC., Santa Clara, CA (US)

( * ) Notice: Subject to any disclaimer, the term of this patent is extended or adjusted under 35 U.S.C. 154(b) by 265 days.

(21) Appl. No.: 17/554,645

(22) Filed: Dec. 17, 2021

(65) Prior Publication Data

US 2022/0406565 A1 Dec. 22, 2022

(30) Foreign Application Priority Data

Jun. 21, 2021 (WO) ................ PCT/CN2021/101145

(51) Int. Cl.
*H01J 37/32* (2006.01)
*C23C 16/455* (2006.01)
*C23C 16/505* (2006.01)

(52) U.S. Cl.
CPC .. *H01J 37/32091* (2013.01); *C23C 16/45536* (2013.01); *C23C 16/505* (2013.01); *H01J 37/32183* (2013.01)

(58) Field of Classification Search
CPC ............................................... H01J 37/32183
See application file for complete search history.

(56) References Cited

U.S. PATENT DOCUMENTS

| | | | |
|---|---|---|---|
| 6,494,998 B1 * | 12/2002 | Brcka | H01J 37/321 204/192.12 |
| 6,888,313 B2 | 5/2005 | Blackburn et al. | |
| 10,032,608 B2 | 7/2018 | Chen et al. | |
| 10,109,462 B2 | 10/2018 | Hammond, IV et al. | |
| 10,431,428 B2 | 10/2019 | Bhutta et al. | |
| 2002/0076490 A1 | 6/2002 | Chiang et al. | |
| 2002/0076507 A1 | 6/2002 | Chiang et al. | |

(Continued)

FOREIGN PATENT DOCUMENTS

CN 107227446 A 10/2017

OTHER PUBLICATIONS

PCT International Search Report and Written Opinion for PCT/CN2021/101145 dated Mar. 23, 2022.

*Primary Examiner* — Keath T Chen
(74) *Attorney, Agent, or Firm* — MOSER TABOA

(57) ABSTRACT

Methods and apparatus for controlling plasma in a process chamber leverage an RF termination filter which provides an RF path to ground. In some embodiments, an apparatus may include a DC filter configured to be electrically connected between a DC power supply and electrodes embedded in an electrostatic chuck where the DC filter is configured to block DC current from the DC power supply from flowing through the DC filter and an RF termination filter configured to be electrically connected between the DC filter and an RF ground of the process chamber where the RF termination filter is configured to adjust an impedance of the electrodes relative to the RF ground.

18 Claims, 5 Drawing Sheets

(56) References Cited

U.S. PATENT DOCUMENTS

| | | | |
|---|---|---|---|
| 2010/0055342 A1* | 3/2010 | Chiang | H01L 21/28562 427/535 |
| 2010/0252417 A1 | 10/2010 | Allen et al. | |
| 2015/0214653 A1* | 7/2015 | Sakane | C23C 16/4586 439/190 |
| 2017/0162417 A1 | 6/2017 | Ye et al. | |
| 2019/0341232 A1* | 11/2019 | Thokachichu | H01L 21/02274 |

* cited by examiner

METHODS AND APPARATUS FOR CONTROLLING RADIO FREQUENCY ELECTRODE IMPEDANCES IN PROCESS CHAMBERS

CROSS-REFERENCE TO RELATED APPLICATIONS

This application claims the benefit of Patent Cooperation Treaty Application PCT/CN2021/101145, filed on 21 Jun. 2021, which is herein incorporated by reference in its entirety.

FIELD

Embodiments of the present principles generally relate to semiconductor manufacturing.

BACKGROUND

In some semiconductor process chambers, plasma is used to deposit films onto substrates. The plasma sputters target material, not only on the substrate, but also on the process chamber shielding as well. When the target material is a metal oxide, RF power is typically used to sputter the target to deposit the dielectric material onto the substrate. During deposition, the process chamber shielding is also coated with the dielectric material. The buildup of dielectric material inside the process chamber creates a high impedance path to ground for the RF. As the impedance increases, the RF will seek out lower impedance paths to ground which may result in the formation of plasma outside of the processing volume of the process chamber. The leaked plasma reduces the density of the confined plasma in the processing volume, causing low quality depositions. Some lower impedance paths for the RF may lead to damaged chamber components.

Accordingly, the inventors have provided improved methods and apparatus for providing a low impedance RF path in a process chamber that increases film performance, chamber component longevity, and substrate yields.

SUMMARY

Methods and apparatus for providing low impedance RF paths for process chambers are provided herein.

In some embodiments, an apparatus for controlling RF current in a process chamber may comprise a DC filter configured to be electrically connected between a DC power supply and at least one electrode embedded in an electrostatic chuck, the DC filter configured to block DC current from the DC power supply from flowing through the DC filter and an RF termination filter configured to be electrically connected between the DC filter and an RF ground of the process chamber where the RF termination filter is configured to adjust an impedance of the at least one electrode relative to the RF ground.

In some embodiments, the apparatus may further include wherein the DC filter includes at least one capacitor connected between a positive lead of the DC power supply and the RF termination filter and at least one capacitor connected between a negative lead of the DC power supply and the RF termination filter, wherein the RF termination filter includes a plurality of capacitors in parallel which are configured to be disposed between the DC filter and the RF ground, wherein an impedance of the RF termination filter is tunable, wherein the RF termination filter includes at least one inductor and at least one variable capacitor that is configured to allow altering of a resonant frequency of the RF termination filter to provide tuning of the impedance of the RF termination filter, wherein the RF termination filter includes a voltage/current sensor, wherein the voltage/current sensor is connected to a controller which is connected to the RF termination filter and wherein the controller is configured to automatically alter the impedance of the at least one electrode through adjustment of an impedance of the RF termination filter, wherein the controller automatically alters the impedance of the at least one electrode to maintain a voltage level across the RF termination filter or to maintain a current level through the RF termination filter, and/or wherein a voltage or a current of the RF termination filter is configured to be adjusted by a controller based on, at least partially, a chamber process condition drift.

In some embodiments, an apparatus for processing substrates may comprise a process chamber with a processing volume configured to confine plasma, an upper electrode of the process chamber electrically connected to an RF power supply, at least one lower electrode of the process chamber embedded in an electrostatic chuck assembly and electrically connected via an RF filter to a DC power supply, at least one AC heater of the process chamber embedded in the electrostatic chuck assembly that is electrically connected via at least one AC filter to an AC power supply, a DC filter configured to be electrically connected between the RF filter of the DC power supply and the at least one lower electrode embedded in the electrostatic chuck assembly where the DC filter is configured to block DC current from the DC power supply from flowing through the DC filter, and an RF termination filter configured to be electrically connected between the DC filter and an RF ground of the process chamber where the RF termination filter is configured to alter an impedance of the at least one lower electrode to the RF ground.

In some embodiments, the apparatus may further include wherein the DC filter includes at least one capacitor connected between a positive terminal of the RF filter and the RF termination filter and at least one capacitor connected between a negative terminal of the RF filter and the RF termination filter, wherein the RF termination filter includes a plurality of capacitors in parallel which are configured to be disposed between the DC filter and the RF ground, wherein an impedance of the RF termination filter is tunable, wherein the RF termination filter includes at least one inductor and at least one variable capacitor that is configured to allow altering of a resonant frequency of the RF termination filter to provide tuning of the impedance of the RF termination filter and the impedance of the lower electrode, wherein the RF termination filter includes a voltage/current sensor and wherein the voltage/current sensor is connected to a controller which is connected to the RF termination filter and wherein the controller is configured to automatically adjust the impedance of the lower electrode in the process chamber through adjustment of impedance of the RF termination filter, and/or wherein the controller is configured to automatically adjusts the impedance of the lower electrode in the process chamber to maintain a voltage level across the RF termination filter or to maintain a current level through the RF termination filter.

In some embodiments, a method of controlling RF current in a process chamber may comprise establishing an RF path to ground between a DC power supply and electrodes in an electrostatic chuck of the process chamber, blocking DC current originating from the DC power supply from entering the RF path to ground, and adjusting an impedance of the electrodes in the electrostatic chuck by adjusting RF current flowing through the RF path to ground with an RF termination filter configured to control RF current flow based on, at least, an impedance value of the RF termination filter.

In some embodiments, the method may further include controlling the RF current flowing through the RF path to ground based on, at least, a current level through the RF termination filter or a voltage level across the RF termination filter, automatically altering the impedance of the electrodes in the process chamber by automatically altering the impedance value of the RF termination filter, and/or altering an impedance value of the RF termination filter based on, at least, chamber process condition drift.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
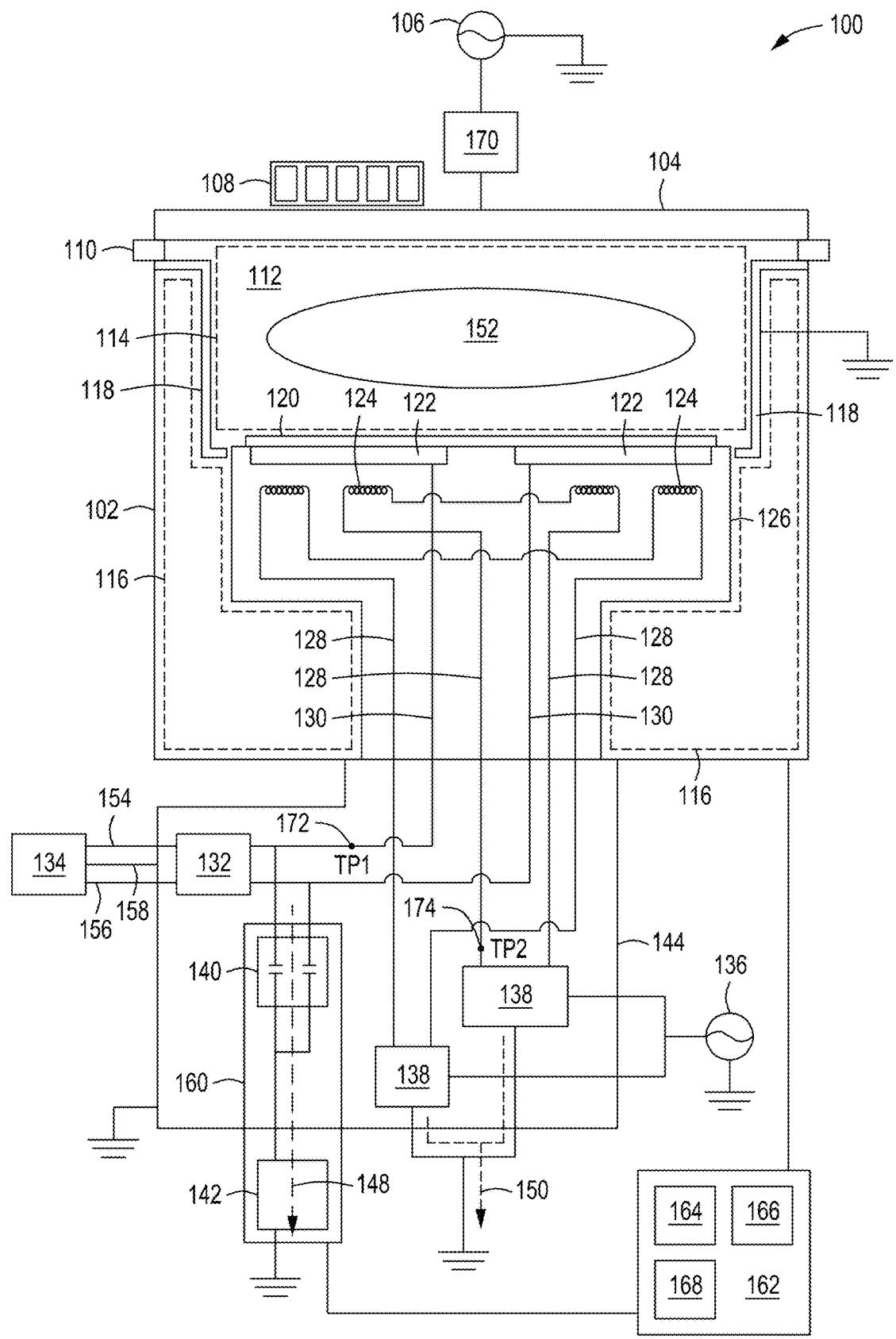
FIG. 1 depicts a cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide innovative tuning hardware and processes to tune the impedance of RF electrodes and provide RF termination to ground. The methods and apparatus of the present principles facilitates in resolving plasma going from a confined mode (confined within a preferred main plasma processing volume defined by a target, a pedestal, and surrounding shields) to an unconfined plasma or leaked mode and also in resolving RF overheating and burning of electromagnetic interference (EMI) filters used in AC lines for pedestal heaters. In some process chambers, RF termination is indirectly achieved through capacitive coupling from electrostatic chuck (ESC) electrodes to heating elements in the pedestal and eventually to a ground path inside the AC heater EMI filters. Commercially available EMI filters are compact in size and not designed for operation at RF frequencies such as, for example, 13.56 MHz and the like. The impedance of the EMI filters at RF frequencies is not very high, resulting in substantial RF heating, quickly rising temperatures, and, sometimes, burning of the EMI filters in a severe situation. The methods and apparatus of the present principles provides solutions to both leaked plasma and RF overheating of the EMI filters. The innovative tuning hardware and processes provide a path to terminate RF to ground and further tune the impedance of the electrodes to RF ground, so as to substantially reduce RF voltages at the electrodes and also at the AC heating elements, achieving confined plasma and substantially reducing RF heating on EMI line filters.

FIG. 1 depicts a cross-sectional view 100 of a process chamber 102 in accordance with some embodiments. The process chamber 102 includes a processing volume 112 in which plasma 152 is formed. The plasma 152 is generated using RF power supplied by an RF power source 106 via a match network 170 connected to a target 104. In some embodiments, a pulsed DC power source may be used with a metallic material target. A magnetron assembly 108 may also be used in generating plasma. The magnetron assembly 108 rotates in the z-axis and generates a very strong local magnetic field to constrain the electrons in the plasma to enhance the plasma density. The target 104 acts as an upper or top electrode with isolators 110 to electrically isolate the target 104 from the rest of the process chamber 102 which is grounded. A substrate 120 is supported by a pedestal 126 that includes electrodes 122 for electrostatically chucking the substrate 120. In some embodiments, the electrodes 122 may comprise multiple pads arranged in a circle or other pattern (not shown). The electrodes 122 are connected via DC conduits 130 to a high-voltage DC power supply 134 via an RF filter 132 that blocks RF currents from the high-voltage DC power supply 134.

The electrodes 122 may serve a dual purpose of conducting DC current for electrostatic chucking of substrates and as a bottom RF electrode during plasma generation. In some instances, the RF on the electrodes 122 may capacitively couple to the heaters 124 when the RF voltage on the electrodes 122 becomes high and couples with the AC lines. The RF then passes down the AC lines to the electromagnetic interference (EMI) filters 138 to ground. The high-voltage DC power supply 134 has a positive lead 154, a negative lead 156, and a reference ground 158. The high-voltage DC power supply 134 produces a positive DC charge and a negative DC charge on the surface of the pedestal 126 to electrostatically hold the substrate to the pedestal 126 during deposition processing. The pedestal 126 also includes heaters 124 embedded below the electrodes 122 that may heat the substrate 120 during deposition processes. The heaters 124 are connected by AC conduits 128 to an AC heater power supply 136 via one or more EMI filters 138. The EMI filters 138 attempt to block any RF going through the AC power lines. In some embodiments, the heaters 124 may be divided into an inner zone and an outer zone to permit different temperature control of the different zones.

Figure 4:
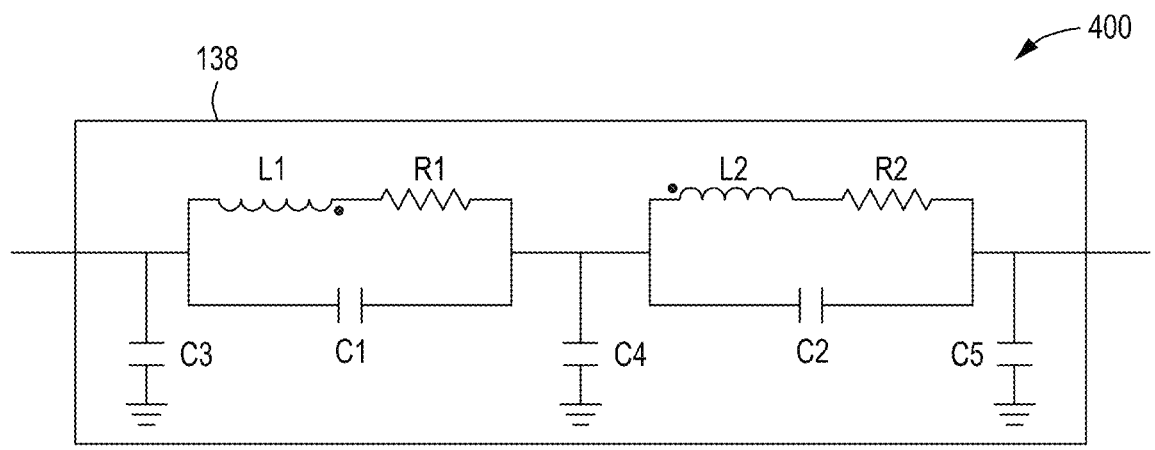
FIG. 4 depicts a schematic of an AC heater EMI circuit in accordance with some embodiments of the present principles.

Initially, during processing, a process shield 118 provides a good RF ground path. The process shield 118 may be formed from stainless steel material. In some embodiments, the process shield may be formed with 'wavy' walls (not shown) to help increase the ground surface area of the process shield. After deposition of a target, the process shield 118 is coated with dielectric material which raises the RF impedance of the process shield 118, and the RF seeks out other paths to ground with lower RF impedances. One such RF path to ground is through the EMI filters 138 for the AC heater power supply 136. The RF power in the electrodes 122 couples with the heaters 124, and RF current flows through the AC conduits and into the EMI filters 138. As depicted in a view 400 of FIG. 4, the EMI filters 138 have inductors (L1, L2) along with resistors (R1, R2) in parallel with capacitors (C1, C2) to filter out EMI from the AC heater lines. Capacitors C3, C4, C5 are connected from the lines to ground and provide a first alternative RF path to ground 150 for RF currents. As the RF currents travel to ground through the EMI filters 138, the RF currents heat up the EMI filters 138 causing a substantial heating of the EMI filters 138 and possible thermal damage. If the capacitor values of capacitors C3, C4, C5 are decreased to reduce RF current flow to reduce heating of the EMI filters 138, the RF current is forced to find other less restrictive paths to ground. In other words, to reduce RF heating of the EMI filter, a higher impedance is needed and to obtain a good path to ground for RF currents, a lower impedance is needed. The conflicting requirements cannot be simultaneously solved without significant compromises.

Figure 2:
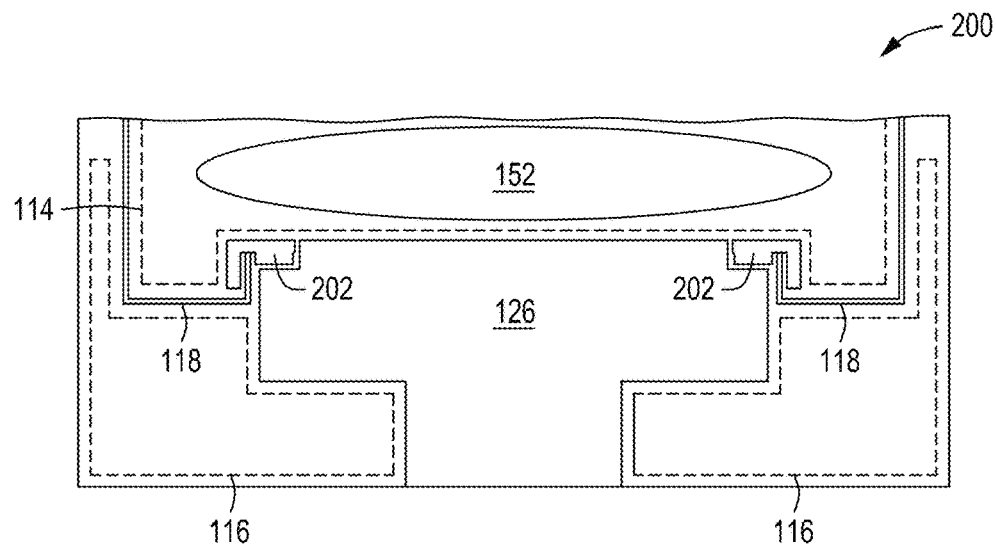
FIG. 2 depicts a cross-sectional view of a section of a process chamber with a lowered pedestal in accordance with some embodiments of the present principles.

Another issue observed by the inventors is due to the types of deposition films produced by some process chambers. The process chamber 102 may be a physical vapor deposition (PVD) plasma process chamber that is used to deposit metal oxide films such as $TiO_2$ and $AlO_2O_3$, piezo electric films such as PZT (lead zirconate titanate), and PMNPT (lead magnesium niobate-lead titanate) for a wide range of applications. The depositions generally require higher power (e.g., 2500 W or more) and raising of the pedestal 126 to form a spacing or gap between the processing volume 112 of the process chamber 102 and areas outside of the processing volume 112 below the pedestal 126. In the cross-sectional view 200 of FIG. 2, the pedestal 126 is in a lowered state and a cover ring 202 rests on an upward lip of the process shield 118. When the cover ring 202 and the process shield 118 are in contact, no gap exists to allow plasma in the processing volume 112 to enter areas below the pedestal 126. The plasma 152 is essentially 'confined' in the processing volume 112 by the target 104, the process shield 118, and the pedestal 126. When the plasma 152 is within the processing volume 112, the plasma is denoted as 'confined plasma' in the confined area 114.

Figure 3:
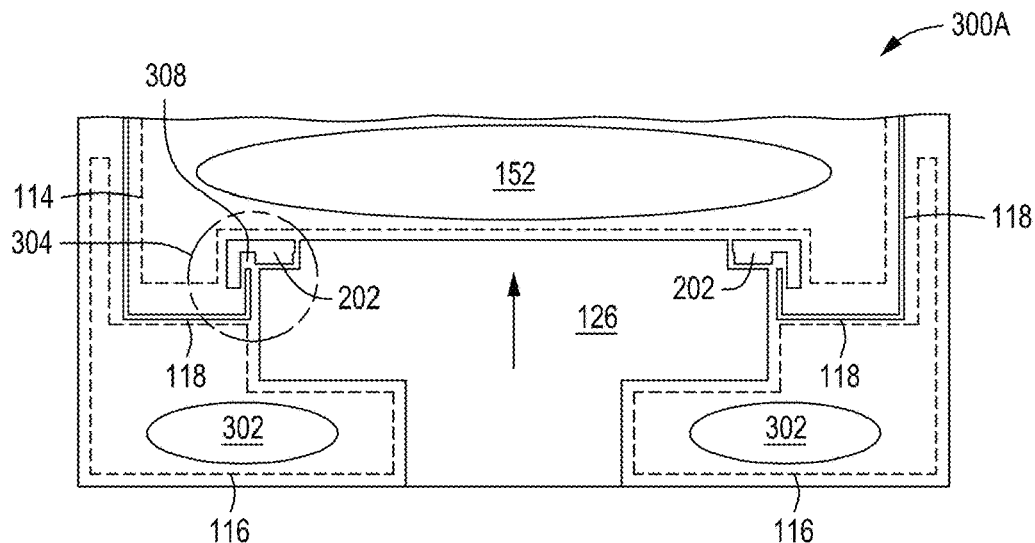
FIG. 3 depicts a cross-sectional view of a section of a process chamber with a raised pedestal in accordance with some embodiments of the present principles.
Figure 3:
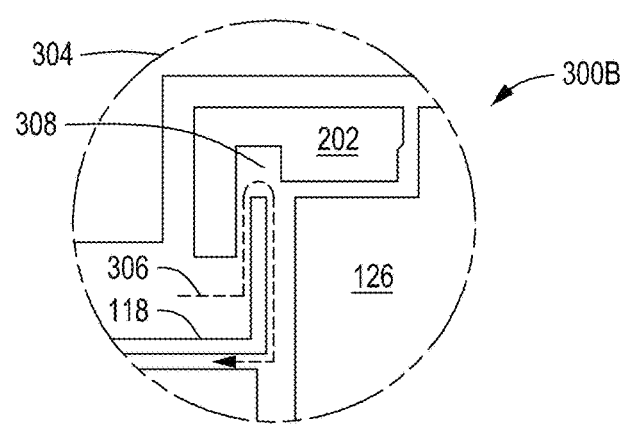

As some deposition processes require a gap 308 depicted in views 300A and 300B in FIG. 3, some residual ionized species 306 may leak from the processing volume 112 and the confined area 114 into a lower region under the pedestal 126 and into an unconfined area 116. The gap 308 is shown in substrate portion 304 of views 300A and 300B. One of the major challenges for RF operation in the process chamber 102 is to achieve and maintain stable, confined plasma, which is confined within the processing volume 112. As more depositions are run, high-K dielectric films are coated on the grounded process shields, and the effective grounded surface area is significantly reduced by the depositions. As the ratio of the areas of the powered electrode versus the grounded electrode increases, the voltage drop across the plasma sheath over the ground electrode increases, raising plasma potential. Consequently, the RF voltages on the ESC electrodes and heating elements embedded beneath the ESC are floated upwardly. The high RF voltages provide a power source for lighting up and sustaining plasma in the bottom of the process chamber 102 in the unconfined areas 116. The plasma formed beneath the pedestal is denoted as leaked or 'unconfined plasma' 302. The inventors have found that as more substrates are processed, the deposition processes are more prone to transition from the confined plasm mode to the unconfined plasma or leaked mode, (e.g., leaked plasma occurring when RF hours exceed approximately 3.6 kWh or more). Once an unconfined plasma condition exists, the plasma 152 in the confined area 114 becomes significantly less dense and causes process abnormalities and film deposition abnormalities to occur.

As discussed above, existing RF termination in RF PVD process chambers is indirectly achieved through capacitive coupling from the electrodes 122 to the heaters 124 embedded in the pedestal, which are further connected to the EMI filters 138 for the AC heater power supply 136. RF from the electrodes 122 will be eventually terminated through the shunt capacitors C3-C5 inside the EMI filters 138 (see, e.g., FIG. 4). Most process chambers use commercially available EMI filters that are very compact in size and not designed for operation at high frequency RF such as, but not limited to, 13.56 MHz and the like. The RF impedance to ground is on the order of a few hundred ohms and is not sufficiently high to reduce RF current flow. The RF coupled and shunt into the EMI filter can then result in substantial heating of the EMI filter with a fast rise in temperature and even burning of the EMI filter in severe situations. Furthermore, the arrangement is largely constrained by the two conflicting requirements— good RF termination requires lower impedance of the EMI filter which can lead to increased RF heating on the filter— and less RF heating and less RF leakage to the filter requires much higher impedance. The inventors have observed that choosing a middle point to balance the two requirements is difficult.

The inventors have discovered a solution to the issues by implementing an RF termination assembly 160 connected to the negative and positive supplies of the high-voltage DC power supply 134 between the RF filter 132 and the electrodes 122. The RF termination assembly 160 provides a second alternative RF path to ground 148. The RF termination assembly 160 includes a DC filter 140 to block DC current from flowing through the RF termination assembly 160 and an RF termination filter 142 that controls the RF current flowing to ground. In some embodiments, all or portions of the RF termination assembly 160 may be physically located in an AC box 144 of the process chamber and/or physically located external to the AC box 144. As depicted in a view 500 of FIG. 5, the DC filter 140 may include one or more capacitors C1 502 to block DC current from the positive DC power supply and one or more capacitors C2 504 to block DC current from the negative DC power supply. A first variant RF termination filter 142A may include one or more capacitors C1 506 with a fixed value to provide control of the impedance of the electrodes 122. As depicted in a view 600 of FIG. 6, a third variant RF termination filter 142C may include a plurality of capacitors (e.g., C1-C4 602-608) in parallel to handle higher RF current loads and to improve reliability. The parallel capacitors can be selected such that each handles 30% or less of the rated current load to allow for one or more capacitor failures during operation without losing the function of the third variant RF termination filter 142C. The reduced current load on each capacitor also reduces stresses on the capacitors, prolonging the life of the capacitors and increasing mean time between failures (MTBF). In some embodiments, the fixed capacitors are ceramic capacitors.

Figure 5:
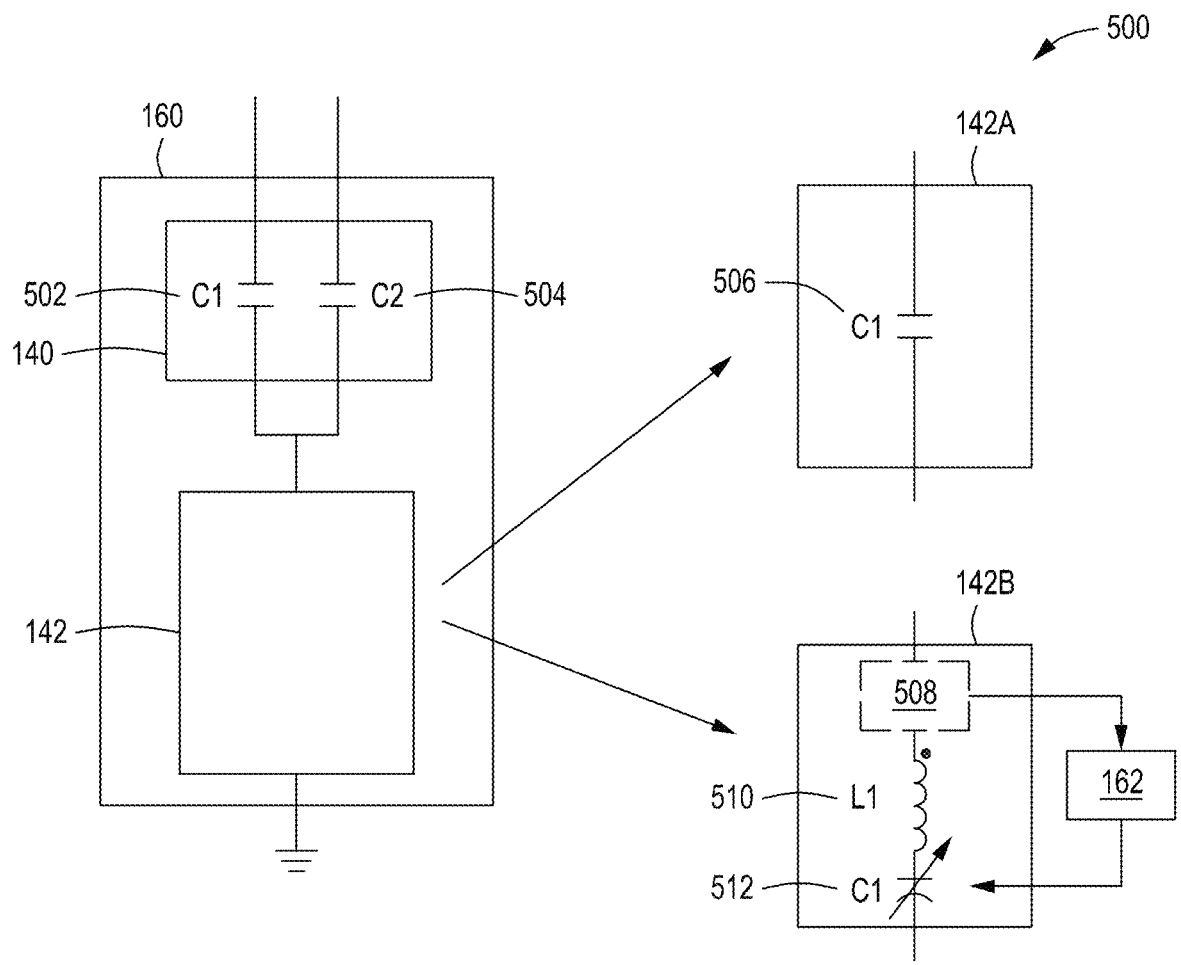
FIG. 5 depicts a block schematic of an apparatus in accordance with some embodiments of the present principles.
Figure 6:
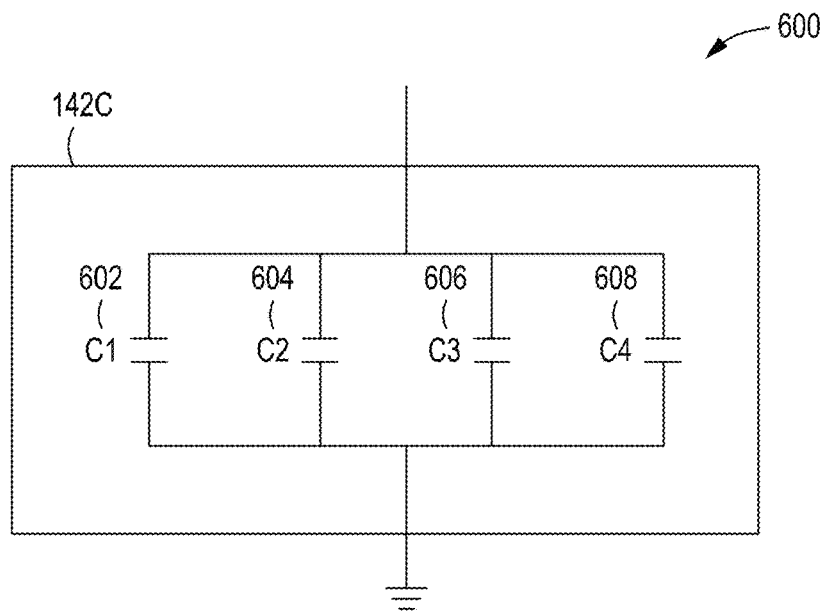
FIG. 6 depicts a schematic of a static apparatus in accordance with some embodiments of the present principles.

In a second variant RF termination filter 142B of FIG. 5, the second variant RF termination filter 142B includes an inductor L1 510 and a variable capacitor C1 512 (e.g., a variable vacuum capacitor). The variable capacitor C1 512 can be varied to alter a resonant frequency of the second variant RF termination filter 142B to change/tune the RF impedance of the electrodes 122 with respect to ground. In some embodiments, an optional voltage/current (V/I) sensor 508 may be used to monitor the voltages of the electrodes 122 and/or the current flowing through the RF termination filter 142. Although the first variant RF termination filter 142A is much less costly to produce and physically more compact than the second variant RF termination filter 142B, the second variant RF termination filter 142B affords greater flexibility in tuning the electrode RF impedances based on number of wafers processed (compensating for chamber process condition drift), a particular process recipe, and/or a particular target material and the like. The optional V/I sensor 508 may send voltage and/or current information to a controller 162 (see FIGS. 1 and 5) that may use the information to automatically adjust/tune the variable capacitor C1 512 to further fine tune the impedance of the electrodes 122 and subsequently the RF voltage level on the electrodes and/or the RF current flowing in the electrodes 122. The controller 162 controls the operation of the process chamber 102 using direct control or alternatively, by controlling the computers (or controllers) associated with the process chamber 102.

In operation, the controller 162 may enable control of the impedance, voltage, and/or current of the electrodes 122 along with data collection and feedback from the respective apparatus and systems to optimize performance of the process chamber 102. The controller 162 generally includes a Central Processing Unit (CPU) 164, a memory 166, and a support circuit 168. The CPU 164 may be any form of a general-purpose computer processor that can be used in an industrial setting. The support circuit 168 is conventionally coupled to the CPU 164 and may comprise a cache, clock circuits, input/output subsystems, power supplies, and the like. Software routines, such as electrode RF impedance tuning methods using the apparatus of the present principles may be stored in the memory 166 and, when executed by the CPU 164, transform the CPU 164 into a specific purpose computer (controller 162). The software routines may also be stored and/or executed by a second controller (not shown) that is located remotely from the process chamber 102.

The memory 166 is in the form of computer-readable storage media that contains instructions, when executed by the CPU 164, to facilitate the operation of the semiconductor processes and equipment. The instructions in the memory 166 are in the form of a program product such as a program that implements electrode impedance tuning methods and the like that include the performance parameters of the apparatus to properly tune the electrode RF impedance. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions, such as electrode RF impedance tuning methods, are aspects of the present principles.

The inventors have observed that as the process shield is coated with high-K dielectric less RF goes to ground through the process shield and an increase in RF goes through the pedestal and some through the bottom of the process chamber (leading to leaked plasma). The addition of the RF termination assembly 160 to the process chamber 102 provides a controllable alternative path for the RF to travel to ground, removing all or at least some of the RF going through the EMI filters and through the bottom of the process chamber. The alternative RF path reduces or eliminates RF heating (and possible burning) of the EMI filters and/or formation of leaked plasma in the process chamber (and increases plasma density in the confined area 114). To determine the effectiveness of the RF termination assembly 160, high voltage probes were installed on the target, test point TP1 172 on the electrode 122, and test point TP2 174 on the AC input wire along with temperature sensors on the EMI filter case. The second variant RF termination filter 142B was used to allow for tuning of the impedance of the electrodes 122. In the baseline conditions with no RF termination assembly 160, when decreasing the target-to-wafer spacing, the gap opening increases and the plasma goes from confined to leaked (unconfined) plasma.

Figure 7:
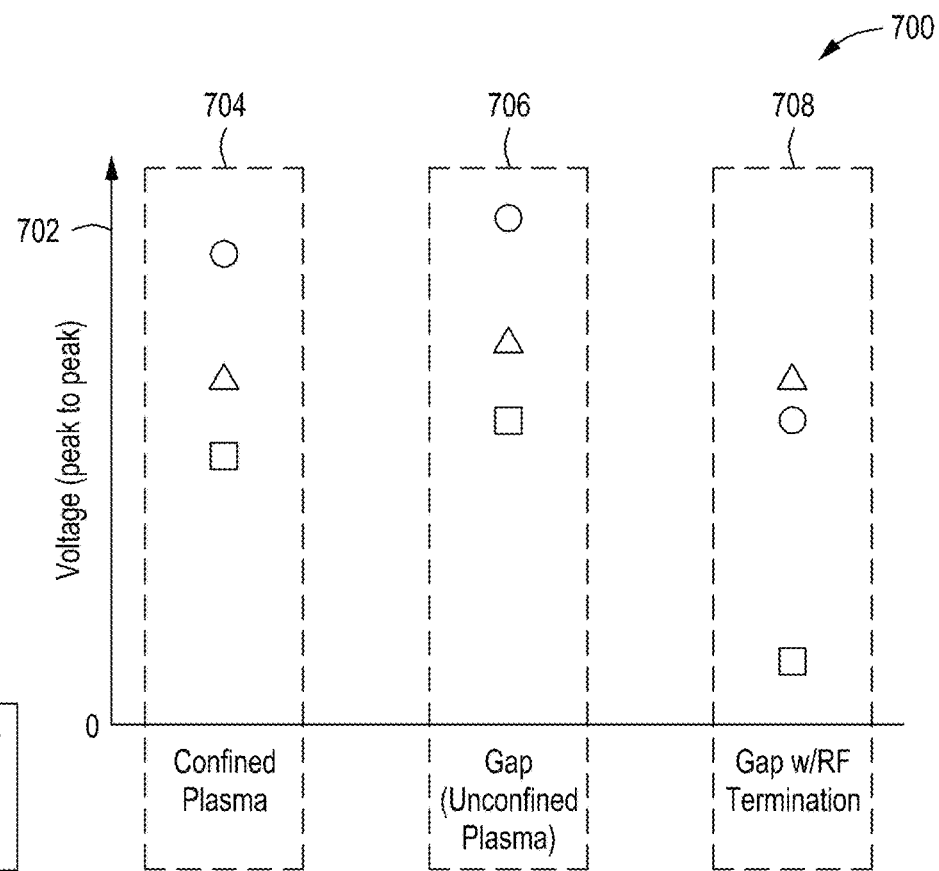
FIG. 7 depicts a graph of voltages in a process chamber in accordance with some embodiments of the present principles.

When the unconfined plasma state occurs, the target voltage increases. The increase in target voltage is depicted in a graph 700 of FIG. 7 when comparing the confined plasma data 704 to the unconfined plasma data 706 (y-axis 702 of graph 700 is peak-to-peak voltage). The increase in target voltage is the result of lower plasma density and higher plasma impedance in the processing volume 112 (plasma 152). Higher target voltage yields higher plasma potential, which yields higher floating potential on the electrodes 122 and heaters 124, as a result, the RF voltages on the electrodes 122 (TP1 172) and the heaters 124 (TP2 174) increase. With the RF termination assembly 160 implemented (with second variant RF termination filter 142B) in the process chamber 102 and the capacitor C1 512 set near a 5% value, the plasma that was previously leaked through the open gap becomes confined and no longer leaks into the unconfined area 116. The corresponding RF voltages on the electrode 122 (TP1 172) and the heater 124 (TP2 174) are substantially reduced as noted in the graph 700 of the gap with RF termination data 708. In particular, the RF voltage at the TP2 174 of the EMI filter 138 is reduced by over four times, resulting in a reduction of RF heating on the EMI filter 138 by approximately 18 times and with much less temperature rise. In some embodiments, the RF current through the RF termination assembly 160 was approximately 5 amps to approximately 8.5 amps. RF of amperage equal to or greater than approximately 5 amps significantly reduces the current flowing in other RF paths to ground to stop the unconfined plasma and/or to significantly reduce the heating of the EMI filters.

Figure 8:
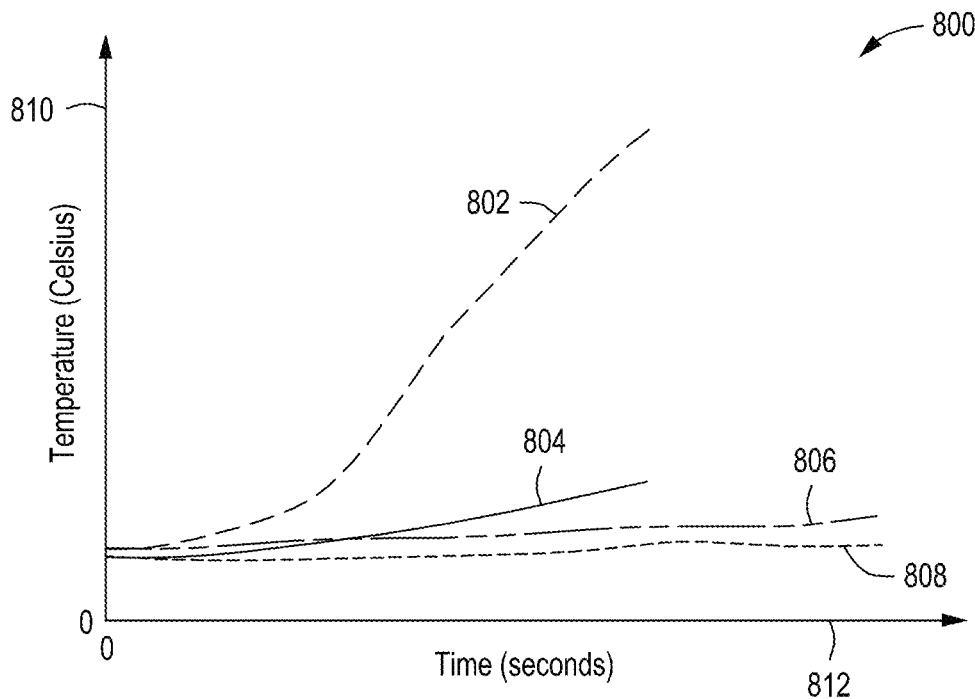
FIG. 8 depicts a graph of temperatures of components in a process chamber in accordance with some embodiments of the present principles.

As shown in a graph 800 of FIG. 8, temperature 810 is plotted on the vertical axis and time 812 is plotted on the horizontal axis. The temperature of the EMI filter wire with no RF Termination 802 rises quickly at the rate of approximately 0.25 C/sec, while the temperature for the EMI filter wire with the RF Termination 806 rises barely for the same period at the rate of approximately 0.0086 C/sec (reduced by 29.5 times), and the temperature reaches a steady-state temperature of less than approximately 40 degrees Celsius after running 6 wafers for 6000 sec. Similar, though less dramatic, temperature changes occur when the case of the EMI filter is monitored. The temperature of the EMI filter case with no RF Termination 804 rises much quicker than the EMI filter case with RF Termination 808. The temperature results of the EMI filter case are scaled down from the results of the EMI filter wire due to the much slower heating of the metal EMI filter case by the RF currents.

Figure 9:
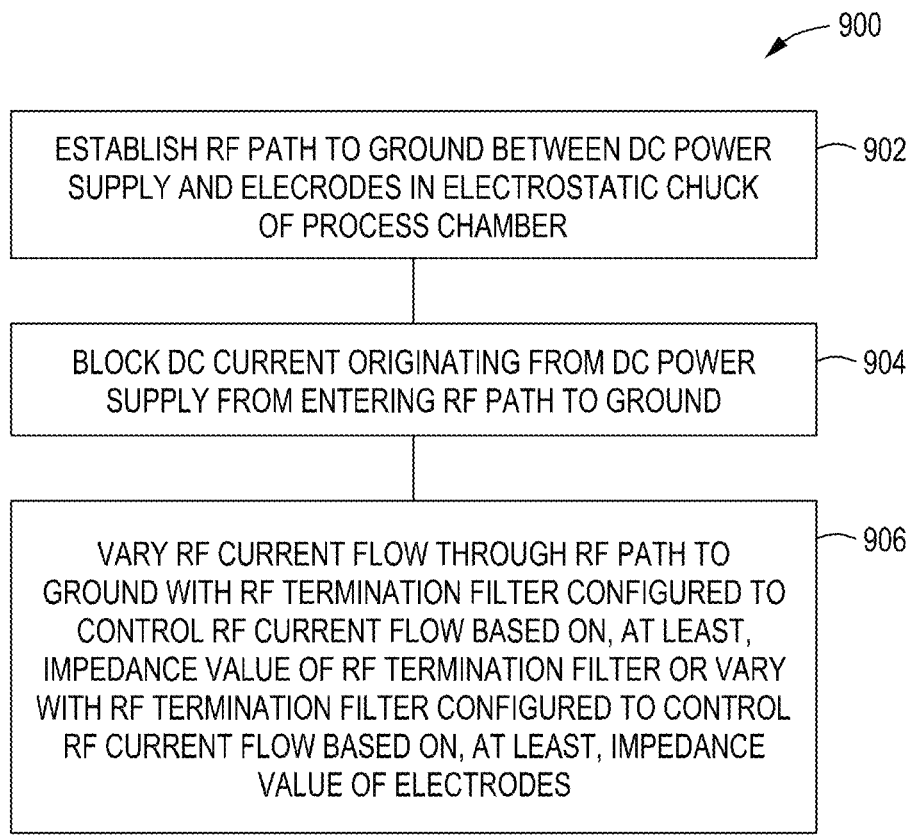
FIG. 9 is a method of controlling RF current in a process chamber in accordance with some embodiments of the present principles.

FIG. 9 is a method 900 of controlling RF current in a process chamber in accordance with some embodiments. In block 902, an RF path to ground is established between a DC power supply and electrodes in an electrostatic chuck of a process chamber. In some embodiments, the RF path to ground may be established between an RF filter of the DC power supply and the electrodes in the electrostatic chuck. In block 904, DC current originating from the DC power supply is blocked from entering the RF path to ground. In some embodiments, one or more capacitive elements may be used for each power lead originating from the DC power supply (e.g., one or more capacitive elements for the positive lead and one or more capacitive elements for the negative lead). In block 906, the RF current flow through the RF path to ground is varied with an RF termination filter configured to control RF current flow based on, at least, an impedance value of the RF termination filter or is varied with an RF termination filter configured to control RF current flow based on, at least, an impedance value of the electrodes. In some embodiments, the RF termination filter may comprise fixed capacitive elements. In some embodiments, the RF termination filter may comprise an inductive element in series with a variable capacitive element to vary the impedance of the electrodes. In some embodiments, a controller may be used along with a voltage-current sensor to allow monitoring of voltage and/or current for automatic adjustment of the RF current through the substrate and the electrodes such as to compensate for chamber process condition drift.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus, comprising:
a physical vapor deposition (PVD) process chamber configured to deposit material using a target and comprising:
a processing volume with a process shield surrounding the process volume,
an electrostatic chuck (ESC) with at least one electrode,
a DC filter, and
an RF termination filter, and
a controller,
wherein the DC filter is configured to be electrically connected at a connection point between an RF filter for a DC power supply and the at least one electrode embedded in the ESC, the DC filter configured to block DC current from the DC power supply from flowing through the DC filter and into the RF termination filter,
wherein the RF termination filter is configured to be electrically connected in series between the DC filter and an RF ground of the PVD process chamber and is configured to adjust an impedance of the at least one electrode relative to the RF ground, and
wherein the controller is configured to interact with the RF termination filter to adjust the impedance of the at least one electrode relative to the RF ground to compensate for changes in impedance of the process shield caused by deposition of target material on the process shield.

2. The apparatus of claim 1, wherein the DC filter includes at least one capacitor connected between a positive lead of the DC power supply and the RF termination filter and at least one capacitor connected between a negative lead of the DC power supply and the RF termination filter.

3. The apparatus of claim 1, wherein the controller adjusts the impedance of the at least one electrode in response to a target voltage increase during processing, a floating potential increase of one or more of the at least one electrode, or a temperature increase of an electromagnetic interference (EMI) filter electrically connected to an alternating current (AC) heater power supply.

4. The apparatus of claim 1, wherein the RF termination filter includes at least one inductor and at least one variable capacitor that is configured to allow altering of a resonant frequency of the RF termination filter by the controller to provide tuning of the impedance of the at least one electrode.

5. The apparatus of claim 1, wherein the RF termination filter includes a voltage/current sensor.

6. The apparatus of claim 5, wherein the voltage/current sensor is connected to the controller which is connected to the RF termination filter and wherein the controller is configured to automatically alter the impedance of the at least one electrode through adjustment of a resonant frequency of the RF termination filter.

7. The apparatus of claim 6, wherein the controller automatically alters the impedance of the at least one electrode to maintain a voltage level across the RF termination filter or to maintain a current level through the RF termination filter.

8. The apparatus of claim 1, wherein a voltage or a current of the RF termination filter is adjusted by the controller to reduce the impedance of the at least one electrode relative to the RF ground based on, at least partially, a number of wafers processed.

9. An apparatus, comprising:
a physical vapor deposition (PVD) process chamber configured to deposit material using a target and comprising:
a processing volume with a process shield surrounding the process volume,
an electrostatic chuck (ESC) assembly with at least one electrode,
a DC filter,
an RF termination filter,
an upper electrode of the PVD process chamber that is electrically connected to an RF power supply, at least one lower electrode of the PVD process chamber that is embedded in the ESC assembly and electrically connected via an RF filter to a DC power supply, and at least one AC heater of the PVD process chamber embedded in the ESC assembly that is electrically connected via at least one AC filter to an AC power supply, and a controller, wherein the DC filter is configured to be electrically connected at a connection point between the RF filter of the DC power supply and the at least one lower electrode embedded in the ESC assembly and is configured to block DC current from the DC power supply from flowing through the DC filter and into the RF termination filter;

wherein the RF termination filter is configured to be electrically connected in series between the DC filter and an RF ground of the PVD process chamber and is configured to alter an impedance of the at least one lower electrode relative to the RF ground; and wherein the controller is configured to interact with the RF termination filter to adjust the impedance of the at least one lower electrode relative to the RF ground to compensate for changes in impedance of the process shield caused by deposition of target material on the process shield.

10. The apparatus of claim 9, wherein the DC filter includes at least one capacitor connected between a positive terminal of the RF filter and the RF termination filter and at least one capacitor connected between a negative terminal of the RF filter and the RF termination filter.

11. The apparatus of claim 9, wherein the controller adjusts the impedance of the at least one lower electrode in based on, at least in part, a number of wafers run in a process, a type of target material used in a process, or a predicted loss of grounded surface area during a process.

12. The apparatus of claim 9, wherein the RF termination filter includes at least one inductor and at least one variable capacitor that is configured to allow altering of a resonant frequency of the RF termination filter by the controller to provide tuning of the impedance of the lower electrode.

13. The apparatus of claim 9, wherein the RF termination filter includes a voltage/current sensor and wherein the voltage/current sensor is connected to the controller which is connected to the RF termination filter and wherein the controller is configured to automatically adjust the impedance of the at least one lower electrode in the PVD process chamber through adjustment of a resonant frequency of the RF termination filter.

14. The apparatus of claim 13, wherein the controller is configured to automatically adjust the impedance of the at least one lower electrode in the PVD process chamber to maintain a voltage level across the RF termination filter or to maintain a current level through the RF termination filter.

15. A method of controlling RF current in a physical vapor deposition (PVD) process chamber using the apparatus of claim 1, comprising:

establishing an RF path to ground between a DC power supply and electrodes in an electrostatic chuck of the PVD process chamber, wherein the PVD process chamber has a processing volume surrounded by a process shield;

blocking DC current originating from the DC power supply from entering the RF path to ground; and adjusting an impedance of the electrodes in the electrostatic chuck relative to an RF ground to compensate for changes in impedance of the process shield caused by deposition of target material on the process shield by adjusting RF current flowing through the RF path to ground with an RF termination filter configured to control RF current flow based on, at least, a resonant frequency of the RF termination filter.

16. The method of claim 15, further comprising:

controlling the RF current flowing through the RF path to ground based on, at least, a current level through the RF termination filter or a voltage level across the RF termination filter.

17. The method of claim 15, further comprising:

automatically altering the impedance of the electrodes in the PVD process chamber by automatically altering the resonant frequency of the RF termination filter.

18. The method of claim 15, further comprising:

altering resonant frequency of the RF termination filter based on, at least, a target voltage increase during processing, a floating potential increase of one or more of the electrodes in the electrostatic chuck, or a temperature increase of an electromagnetic interference (EMI) filter electrically connected to an alternating current (AC) heater power supply.

* * * * *